(12) United States Patent
Sasaki et al.

(10) Patent No.: US 8,704,342 B2
(45) Date of Patent: Apr. 22, 2014

(54) RESIN SEALING TYPE SEMICONDUCTOR DEVICE AND METHOD OF MANUFACTURING THE SAME, AND LEAD FRAME

(75) Inventors: Takeshi Sasaki, Ota (JP); Masahiro Shindo, Ashikaga (JP); Kazumi Onda, Hanyu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 516 days.

(21) Appl. No.: 12/549,762

(22) Filed: Aug. 28, 2009

(65) Prior Publication Data

US 2010/0052125 A1 Mar. 4, 2010

(30) Foreign Application Priority Data

Aug. 29, 2008 (JP) ................. 2008-220980
Aug. 29, 2008 (JP) ................. 2008-220981
Apr. 28, 2009 (JP) ................. 2009-108812

(51) Int. Cl.
*H01L 23/495* (2006.01)

(52) U.S. Cl.
USPC ........... 257/666; 257/773; 438/123; 438/618; 438/666

(58) Field of Classification Search
USPC ........................................... 257/666
See application file for complete search history.

(56) References Cited

U.S. PATENT DOCUMENTS

| 2002/0145181 | A1* | 10/2002 | Myer et al. ............... 257/666 |
| 2003/0160306 | A1* | 8/2003 | Gibson et al. ............. 257/666 |
| 2004/0183168 | A1 | 9/2004 | Miyamoto et al. |

FOREIGN PATENT DOCUMENTS

| CN | 1532925 | 9/2004 |
| JP | 56-32460 | 3/1981 |
| JP | 57-95642 | 6/1982 |
| JP | 63-73632 | 4/1988 |
| JP | 9-199656 | 7/1997 |
| JP | 9-270441 | 10/1997 |
| JP | 10-256447 | 9/1998 |
| JP | 2005-064076 | 3/2005 |

OTHER PUBLICATIONS

Handotai Shingijutsu Kenkyukai ed. (2007) "Function and aim of semiconductor pakage" in *All About Leading Edge Packaging Technologies—With Illustrations*. Kogyo Chosakai Publishing Co., Ltd. (3 pages).

* cited by examiner

*Primary Examiner* — Ajay K Arora

(57) ABSTRACT

The invention is directed to firm bonding between semiconductor dies etc bonded to a lead frame and wire-bonding portions of the lead frame by ultrasonic Al wire bonding, and the prevention of shortcircuit between the semiconductor dies etc due to a remaining portion of the outer frame of the lead frame after the outer frame is cut. By extending the wire-bonding portion etc on the lead frame in a wire-bonding direction and connecting the wire-bonding portion etc to the outer frame of the lead frame through a connection lead etc, the ultrasonic vibration force in the ultrasonic Al wire bonding is prevented from dispersing and the Al wire and the wire-bonding portion etc are firmly bonded. The outer frame is cut after a resin sealing process is completed. Even when a portion of the outer frame remains on the side surface of the resin package, connection between the connection lead etc and other hanging lead etc are prevented by providing a notch etc in the outer frame between the connection lead etc and the hanging lead etc.

7 Claims, 5 Drawing Sheets

RESIN SEALING TYPE SEMICONDUCTOR DEVICE AND METHOD OF MANUFACTURING THE SAME, AND LEAD FRAME

CROSS-REFERENCE OF THE INVENTION

This application claims priority from Japanese Patent Application Nos. 2008-220980, 2008-220981 and 2009-108812, the contents of which are incorporated herein by reference in their entireties.

BACKGROUND OF THE INVENTION

1. Field of the Invention

The invention relates to a resin sealing type semiconductor device and a method of manufacturing the same, and a lead frame.

2. Description of the Related Art

A resin sealing type semiconductor device is manufactured by uniting a lead frame and various types of semiconductor dies etc and then resin-sealing these except outer leads and an outer frame. The detail is as follows. First, a lead frame formed by pressing a base metal made of a Cu member etc is provided. The lead frame includes islands to mount semiconductor dies etc on, inner leads having wire-bonding portions etc connected to the bonding pads of the semiconductor dies etc, outer leads extending from the inner leads to the outside of a sealing resin, tie bars supporting the outer leads, an outer frame supporting the whole lead frame, and hanging leads connecting the islands etc and the outer frame in order to support the islands etc divided from the outer frame.

The back surface of the semiconductor die is fixed and die-bonded to the island using a conductive material. The bonding pad on the semiconductor die and the wire-bonding portion on the inner lead are connected by wire-bonding using a gold wire etc. A passive element such as a die capacitor is bridged between the inner leads and also bonded thereto using a conductive material. The lead frame where the semiconductor dies etc are bonded is set in a resin sealing apparatus, resin is injected between the upper mold and lower mold of the resin sealing apparatus in the state where the outer lead portion including the tie bars and the outer frame portion are held therebetween, and the lead frame where the semiconductor dies etc are mounted is resin-sealed. Then, solder plating or the like is applied to the outer leads, and then the tie bars and the outer frame are cut by pressing, and the outer leads are bended according to needs, thereby completing a resin sealing type semiconductor device.

A process of assembling a resin sealing type semiconductor device like this is described in Japanese Patent Application Publication No. 2005-64076 and "Advanced semiconductor packaging technologies by an illustration book" edited by Semiconductor technologies solutions workshop (the first edition issued on Sep. 25, 2007 by Kogyo Chosakai Publishing Co., Ltd.).

In the resin sealing type semiconductor device, usually, the semiconductor die die-bonded to the island on the lead frame is connected to the wire-bonding portion on the inner lead by wire-bonding the pad electrode on the semiconductor die to the wire-bonding portion using an Au wire (a gold wire) as described above. However, since high electric current flows when the output of the semiconductor die is high, the wire for the wire-bonding is needed to be thick. Furthermore, since solder is used for the die-bonding of a power semiconductor die, the wire-bonding at high temperature is difficult. Therefore, in this case, an Al wire (an aluminum wire) that is cheap, low in resistance, and bondable at room temperature is used instead of an expensive Au wire.

When an Au wire is used for the wire-bonding, the portion for the bonding is heated and an alloy of Au and Al is made so as to provide firm bonding by so-called thermocompression bonding. In addition to the heating, ultrasonic waves are often used to increase the bonding force. On the other hand, when an Al wire is used for the wire-bonding, the process is performed at room temperature and thus it is necessary to increase the intensity of ultrasonic waves. This is because it is necessary to break an aluminum oxide film formed on the surface of the pad electrode on the semiconductor die, various oxide films formed on the wire-bonding portion on the lead frame, etc., so as to make the Al wire directly in contact with the aluminum of the pad electrode etc.

In this case, the vibration direction of the ultrasonic waves is in a certain extending direction of the Al wire, and thus it is necessary to concentrate the force on the wire-bonding portion in order to achieve optimum bonding. To this end, one approach is to apply enough force of the vibration of ultrasonic waves to the wire-bonding portion by preventing the force escaping by preventing the wire-bonding portion being isolated on the lead frame.

Furthermore, in the resin sealing type semiconductor device, the passive element etc as well as the semiconductor die may be die-bonded to the island of the lead frame. The die capacitor as the passive element is bridged between the bonding portions on the two different inner leads and bonded thereto.

In this case, when the lead frame is thin, the lead frame is likely to deform by the force applied when the semiconductor die and the passive element are die-bonded or wire-bonded. To address this problem, the hanging leads are provided and connected to the stiff outer frame of the lead frame located on the outside of the package so as to reinforce the mechanical strength.

Since the outer frame of the lead frame connected to these hanging leads is cut and removed at the same time as when the tie bars between the outer leads are cut after the resin sealing, the hanging leads connected to the semiconductor dies etc are also cut and the electrical isolations among the semiconductor dies etc are secured. However, the outer frame may not completely be cut and removed and remain on the side surface of the resin package, and the remaining portion of the outer frame of the lead frame and the hanging lead may remain connected. This may cause shortcircuit between the semiconductor dies etc mounted on the islands etc connected to the hanging leads. A second approach is to eliminate the shortcircuit between the semiconductor dies etc caused by such a remaining portion of the outer frame.

SUMMARY OF THE INVENTION

The invention provides a method of manufacturing a resin sealing type semiconductor device. The method includes providing a lead frame having an island, a wire-bonding portion located in the island, an outer frame, a first connection portion extending in a first direction so as to connect the wire-bonding portion to the outer frame and a second connection portion extending in a second direction so as to connect the wire-bonding portion to the outer frame. The first direction is different from the second direction. The method includes die-bonding a semiconductor die to the island of the lead frame, and wire-bonding the semiconductor die and the wire-bonding portion of the lead frame using a wire comprising aluminum by ultrasonic waves.

The invention provides another method of manufacturing a resin sealing type semiconductor device. The method includes providing a lead frame having an island, an outer frame and a tie bar. A notch is formed in the outer frame. The method includes die-bonding a semiconductor die to the island of the lead frame, electrically connecting the semiconductor die and the lead frame, sealing the lead frame and the semiconductor die bonded to the lead frame by a resin package so that the tie bar and at least a portion of the notch are exposed from the package, and cutting the lead frame so that the exposed tie bar is cut out and the outer frame is cut through the exposed notch along an edge of the package.

The invention also provides a resin sealing type semiconductor device that includes a lead frame having an island, a wire-bonding portion located in the island, a first extension portion extending from the island in a first direction in plan view of the semiconductor device and a second extension portion extending from the island in a second direction in the plan view of the semiconductor device. The first direction is different from the second direction. The device also includes a semiconductor die die-bonded to the island and wire-bonded to the wire-bonding portion using a wire comprising aluminum, and a resin package sealing the lead frame and the semiconductor die.

The invention provides another resin sealing type semiconductor device that includes a lead frame, a semiconductor die that is die-bonded to and wire-bonded to the lead frame, and a resin package sealing the lead frame and the semiconductor die. A portion of the lead frame is exposed along the resin package, and the exposed portion of the lead frame is separated into two portions by a cut made in the lead frame.

The invention further provides a lead frame including an island, an outer frame surrounding the island, and a plurality of connection portions connecting the island and the outer frame. A notch is formed in the outer frame between two connection portions.

DETAILED DESCRIPTION OF THE INVENTION

A first embodiment of the invention will be described hereafter referring to figures.

Although there are some types of lead frame 1 for use in which a plurality of same patterns is arrayed in a single row, in two rows or in three rows, the description will be given by showing one of the patterns in detail since the invention is understood by describing one pattern. The description will be given using a simple package of an SIP (Single In-line Package) type as a package.

Figure 3:
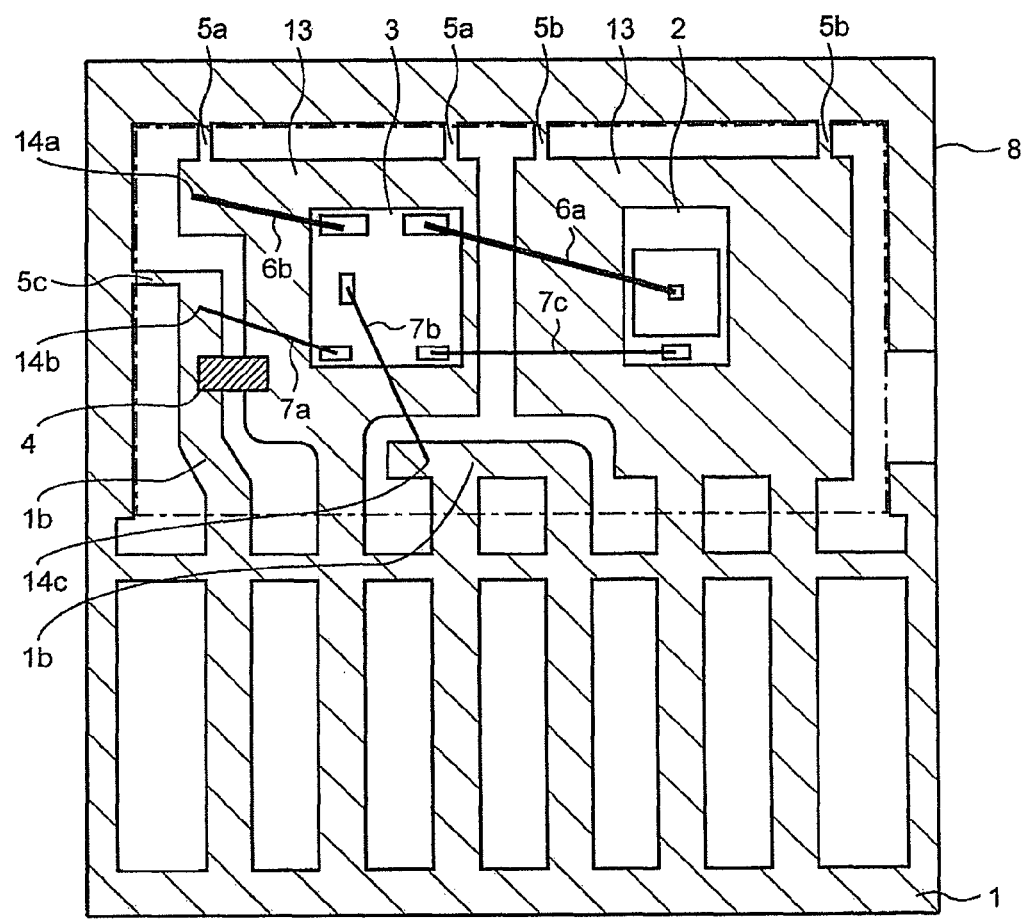
FIG. 3 is a plan view showing a method of manufacturing a resin sealing semiconductor device before it is resin-sealed in a conventional embodiment.

Before the description of the embodiment, the structure of the lead frame 1 for realizing the invention will be described referring to FIG. 3. On the lead frame 1, islands 13 where a power semiconductor die 2 and a controller semiconductor die 3 are mounted, and an island 13 and inner leads 1b where other die capacitor 4 etc are mounted are connected to an outer frame 8 of the lead frame through hanging leads 5a, 5b and 5c, respectively, as shown in FIG. 3, thereby enhancing the stiffness of these. When an Au wire for thermocompression bonding is employed as a wire for wire-bonding the semiconductor die 3 and wire-bonding portions 14a, 14b and 14c of the lead frame 1, the wire-bonding force is mainly applied in the vertical direction to the main surface of the lead frame 1. Therefore, the force applied in the leftward, rightward, upward and downward directions in the main surface of the lead frame 1 shown in FIG. 3 is weak, and thus a problem does not often occur in this structure of the lead frame 1. However, when Al wires 6a, 6b, 7a, 7b and 7c are employed to perform ultrasonic wire-bonding, the intensive force by the ultrasonic vibration is applied in the leftward, rightward, upward and downward directions in the main surface of the lead frame 1, and thus a problem is likely to occur.

Hereafter, the first embodiment of the invention will be described referring to FIG. 1.

First, the lead frame 1 is provided, the power semiconductor die 2 having high current flow and a large heat value is die-bonded to the predetermined island 13 of the lead frame 1 using a solder preform or the like. The lead frame 1 used in this case is made of a Cu member on which Ni etc is plated. The controller semiconductor die 3 is die-bonded to the predetermined island 13 using Ag paste or the like since it has low power consumption. A passive element such as the die capacitor 4 is also bonded to the island 13 and the inner lead 1b of the lead frame 1 using Ag paste. When Ag paste is used for the bonding, Ag is plated on the lead frame 1, too.

Then, ultrasonic wire-bonding is performed between the power semiconductor die 2 and the controller semiconductor die 3 and between the controller semiconductor die 3 and the wire-bonding portion 14a on the lead frame 1 using thick Al wires 6a and 6b, thereby forming a power source line. Simultaneously, ultrasonic wire-bonding is performed between the controller semiconductor die 3 and the gate of the power semiconductor die 2 and between the controller semiconductor die 3 and the wire-bonding portions 14b and 14c on the lead frame 1 through slightly thinner Al wires 7a, 7b and 7c.

It is a concept of the first embodiment of the invention to counter the force applied in the leftward, rightward, upward and downward directions of the lead frame 1 in the ultrasonic bonding using these Al wires so as to effectively use the ultrasonic vibration as wire-bonding force. For example, the ultrasonic vibration direction when the thick Al wire 6b is wire-bonded to the wire-bonding portion 14a on the lead frame 1 will be considered. In this case, the ultrasonic vibration for the Al wire 6b is in the extending direction of the Al wire 6b for the wire-bonding, i.e., a left upward oblique direction in FIG. 1. In this case, the force of the ultrasonic vibration includes upward force and leftward force in the figure. With the hanging lead 5a only, as shown in FIG. 3, since the leftward force is not countered by any seaport structure, the wire-bonding portion 14a on the lead frame 1 is vibrated in the left direction even slightly and thus the ultrasonic force is not used effectively.

Figure 1:
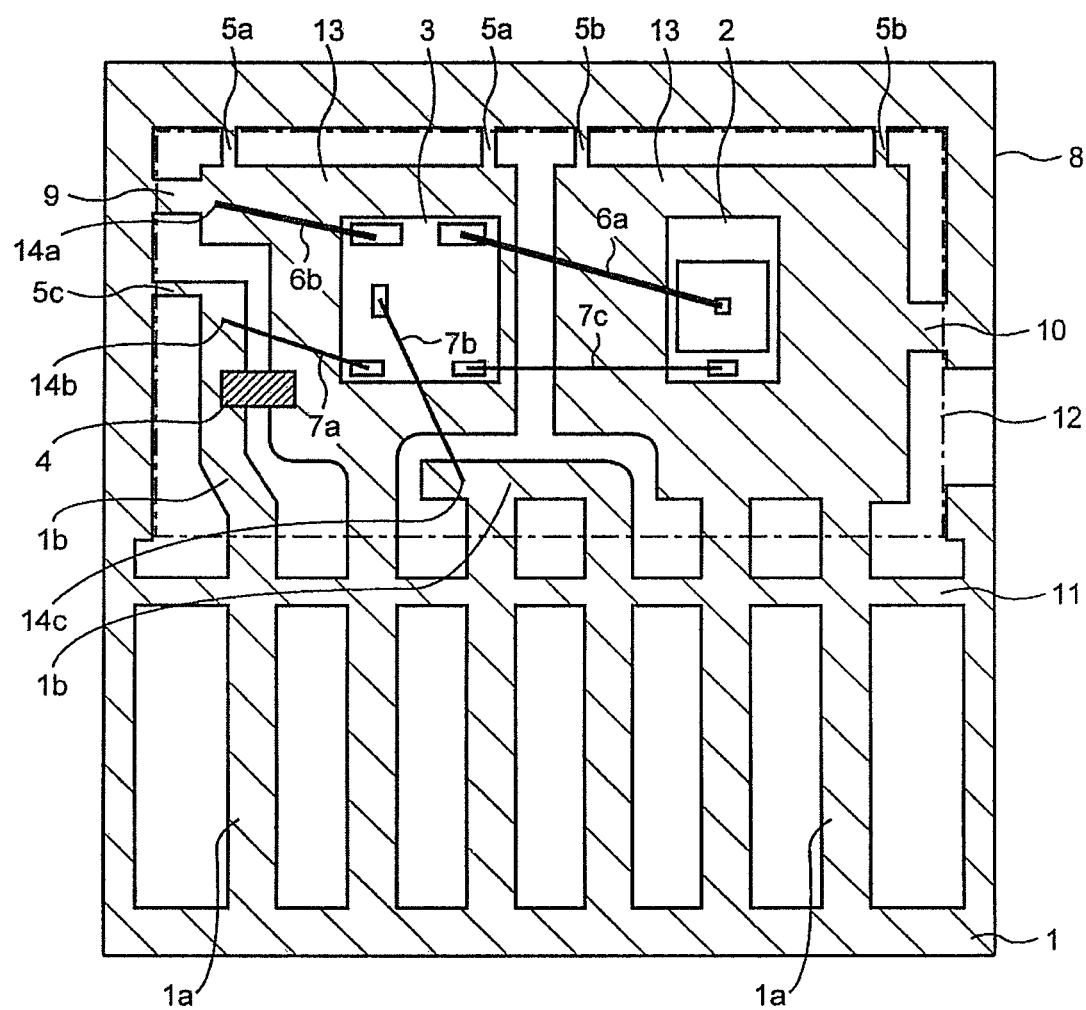
FIG. 1 is a plan view showing a method of manufacturing a resin sealing semiconductor device before it is resin-sealed in a first embodiment of the invention.

On the other hand, in FIG. 1 showing the invention, a connection lead 9 is provided to firmly support the left side of the wire-bonding portion 14a on the lead frame 1, thereby preventing the ultrasonic vibration force from escaping to the left side. Since the connection lead 9 is connected to the stiff outer frame 8 of the lead frame 1, it further prevents the ultrasonic vibration force from escaping to the left side. Also in the ultrasonic vibration force in the right downward oblique direction for bonding the Al wire 6*b* to the pad electrode on the controller semiconductor die 3, similarly, the downward force is countered by the hanging leads 5*a* and the rightward force is countered by the connection lead 9, thereby realizing firm bonding.

Also in the ultrasonic vibration force in the left upward oblique direction for bonding the Al wire 6*a* to the pad electrode on the controller semiconductor die 3, similarly, the upward force is countered by the hanging leads 5*a* and the leftward force is countered by the connection lead 9. Next, the ultrasonic vibration force applied to the pad electrode on the power semiconductor die 2 will be considered. In this case, the ultrasonic vibration force is in the extending direction of the Al wire 6*a*, i.e., in the right downward oblique direction in FIG. 1. The ultrasonic vibration force in this case includes downward force and rightward force. The downward force is countered by the outer leads 1*a*. Although the rightward force is not countered in the case of FIG. 3, a connection lead 10 is provided and formed integrally with the outer frame 8 in FIG. 1 of the invention and thus the rightward force is countered enough.

The vibration force for the ultrasonic wire-bonding of the slightly thinner Al wire 7*a* etc is also countered by the connection lead 9 etc in the similar manner to the thick Al wire 6*a* etc. In the case of the Al wire 7*a*, although the left upward force is applied to a portion of the inner lead 1*b* for the wire bonding, the force is weaker than the Al wire 6*a* etc and thus the upward force and leftward force are countered by the hanging lead 5*c*. In the case of the Al wire 7*b*, the force is mainly applied in the upward and downward directions, the upward force is countered by the hanging leads 5*a* and the downward force is countered by the outer leads 1*a*. In the case of the Al wire 7*c*, the vibration force is applied in the leftward and rightward directions, the force is firmly countered by the connection leads 9 and 10.

As described above, since the ultrasonic vibration force is firmly countered and thus contained by the connection leads 9 and 10 employed in the first embodiment as well as the hanging leads 5*a*, 5*b* and 5*c* and the outer leads 1*a*, stable bonding is achieved even by ultrasonic Al wire bonding to realize wire-bonding with high reliability. Then, the lead frame 1 where the power semiconductor die 2 etc are mounted is resin-sealed in a resin sealing process, and a portion surrounded by a dashed and dotted line in FIG. 1 becomes a resin package 12 filled with resin. Then, the tie bars 11 that support the outer leads 1*a* and the outer frame 8 of the lead frame 1 that support the whole lead frame 1 until the resin sealing process is completed are cut, and according to needs, and a bending process etc are performed to the outer leads 1*a*, thereby completing a resin sealing type semiconductor device.

Figure 4:
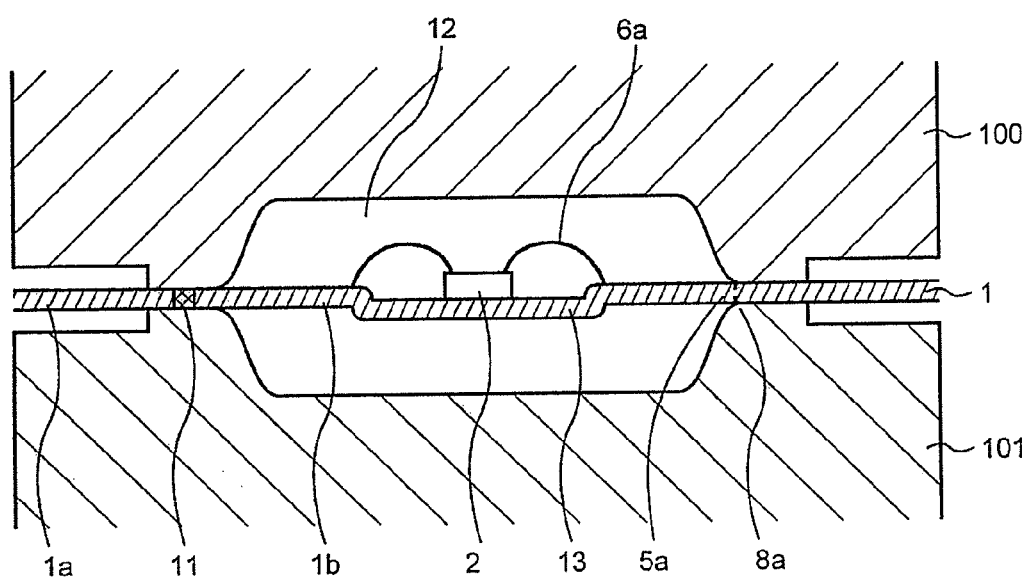
FIG. 4 is a view showing a lead frame where a semiconductor die etc are mounted, that is set in molds of a resin sealing apparatus.

Before the description of a second embodiment, the contents and problems of the resin sealing process and the process of cutting the outer frame 8 of the lead frame 1 will be examined. In the resin sealing process, as shown in FIG. 4, the lead frame 1 where the semiconductor die 2 etc that are wire-bonded through the Al wire 6*a* etc are mounted is held between an upper mold 100 and a lower mold 101 of a resin sealing apparatus, and resin is injected therein. In FIG. 4, the tie bars 11 on the left side are held between the upper mold 100 and the lower mold 101, and serves as dam bars to prevent the resin from flowing to the outside of the resin package 12 from the left side. On the right side, the outer frame 8 of the lead frame 1 is held between the upper mold 100 and the lower mold 101, and prevents the resin from flowing to the outside of the resin package 12 from the right side. On the front and rear sides, similarly, the outer frame 8 prevents resin from flowing to the outside of the resin package 12.

In this case, in order to form the resin package 12 as small as possible, the hanging leads 5*a* etc shown in FIG. 4 that merely support the island 13 etc and have no other function are formed as thin and short as possible. Furthermore, the resin package 12 is formed so that the inner portion 8*a* of the outer frame 8 of the lead frame 1 shown in FIG. 2 and the circumference of the resin package 12 are in contact with each other as shown in FIG. 4. When the resin sealing process is completed, the tie bars 11 and the outer frame 8 that complete the function as a supporting body are cut simultaneously. However, sometimes the outer frame 8 may be not completely removed and a portion of the outer frame 8 may remain on the circumference of the resin package 12 depending on the positional relation etc between the outer side of the resin package 12 and the inner side of the outer frame 8 of the lead frame 1.

In this case, the hanging leads 5*a* etc are connected to the remaining and unnecessary portion of the outer frame 8, and thus become a supporting body for the remaining portion. In particular, since the connection lead 9 etc described above that also function as a kind of hanging leads are formed to have a much larger width than the usual hanging leads 5*a* etc in order to counter the intensive ultrasonic vibration force in the Al wire bonding, these support the remaining unnecessary portion of the outer frame 8 more widely and firmly than the hanging leads 5*a* etc. In detail, in FIG. 1 showing the first embodiment, when the outer frame 8 of the lead frame 1 is cut, since the outer frame 8 extends from the end of the resin package 12 to the outside of the resin package 12, it is difficult to cut the outer frame 8 completely, and the outer frame 8 of the lead frame 1 is much likely to remain thin on the lateral and upper side surfaces of the resin package 12.

If this is not removed by some method, in the case of FIG. 1, a problem occurs such that the hanging lead 5*b* connected to the island 13 where the semiconductor die 2 is mounted and the hanging lead 5*a* connected to the island 13 where the semiconductor die 3 is mounted remain connected through the remaining portion of the outer frame 8 of the lead frame 1 on the side surface of the resin package 12 and are not separated. The same problem also occurs to the connection lead 9 having a much larger width than the hanging lead 5*a* etc, that is provided in order to effectively use the ultrasonic vibration force in the Al wire bonding. In detail, the connection lead 9 connected to the island 13 where the semiconductor die 3 is mounted and the hanging lead 5*c* connected to the inner lead 1*b* to which one of the electrodes of the die capacitor 4 is bonded remain connected through the remaining portion of the outer frame 8 of the lead frame 1 on the side surface of the resin package 12 and are not separated.

In order to prevent or eliminate these problems, the hanging lead 5*a* etc are formed longer to expose a portion of the hanging lead 5*a* etc to the outside of the resin package 12, and in this state the exposed portion is cut together with the outer frame 8, or according to needs, the remaining portion of the outer frame 8 is scraped down from the circumference of the resin package after it is cut. It is noted that the portion of the outer frame 8 that is widely connected to the wide connection lead 9 etc is not easily scraped down. Furthermore, in order to form the hanging lead 5*a* etc longer so as to expose a portion of these to the outside of the resin package 12, a change is needed such that the lead frame 1 is formed larger as a whole by the elongated amount of the hanging lead 5*a* etc, or the width of the outer frame 8 is narrowed by that amount so as not to change the whole size of the lead frame 1.

Hereafter, the second embodiment of the invention will be described in detail referring to FIG. 2. This embodiment prevents the connection between the connection lead 9 etc and the hanging lead 5c etc due to an unnecessary remaining portion of the outer frame 8 of the lead frame 1 and prevents short circuit between the semiconductor devices etc due to a remaining portion of the outer frame 8, without a need for the change in the size of the lead frame 1 and the scraping of the remaining portion of the outer frame 8.

Figure 5:
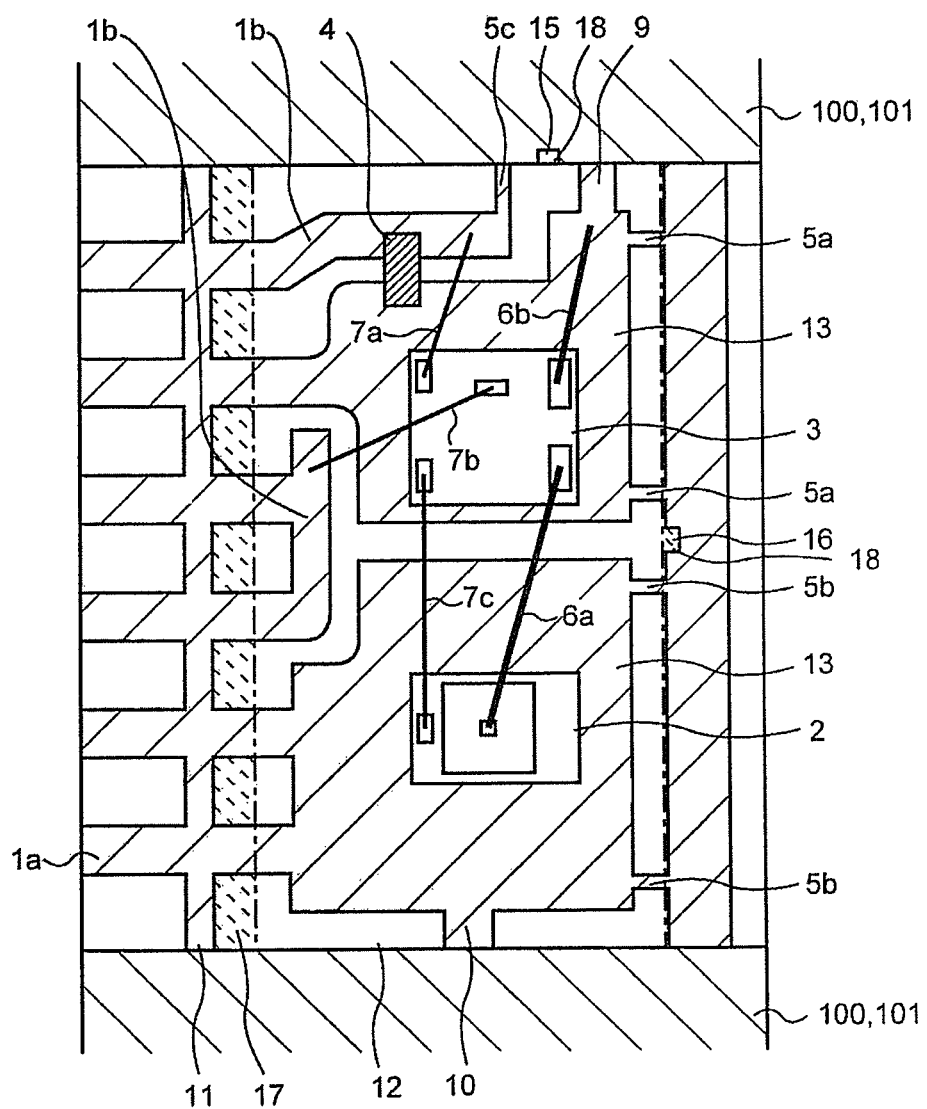
FIG. 5 is a perspective view of the lead frame where the semiconductor die etc are mounted, that is set in the molds of the resin sealing apparatus, from the upper mold side.

FIG. 5 is a perspective view of the resin sealing apparatus shown in FIG. 4 from the upper mold 100 side, showing a structure of the lead frame 1 where the semiconductor device 2 etc are mounted. On the outer leads 1a side, the tie bars 11 are firmly held between the upper mold 100 and the lower mold 101 to serve as dam bars and prevent resin from flowing to the outer lead 1a side. On both the lateral sides and the upper side of the resin package 12, similarly, the outer frame 8 of the lead frame 1 firmly held between the upper mold 100 and the lower mold 101 prevents resin from flowing to the outside of the resin package 12.

In the outer frame 8 of the lead frame 1 held between the upper mold 100 and the lower mold 101, that is in contact with the end of the resin package 12, notches 15 and 16 are formed from the inside toward the outside of the outer frame 8.

Figure 2:
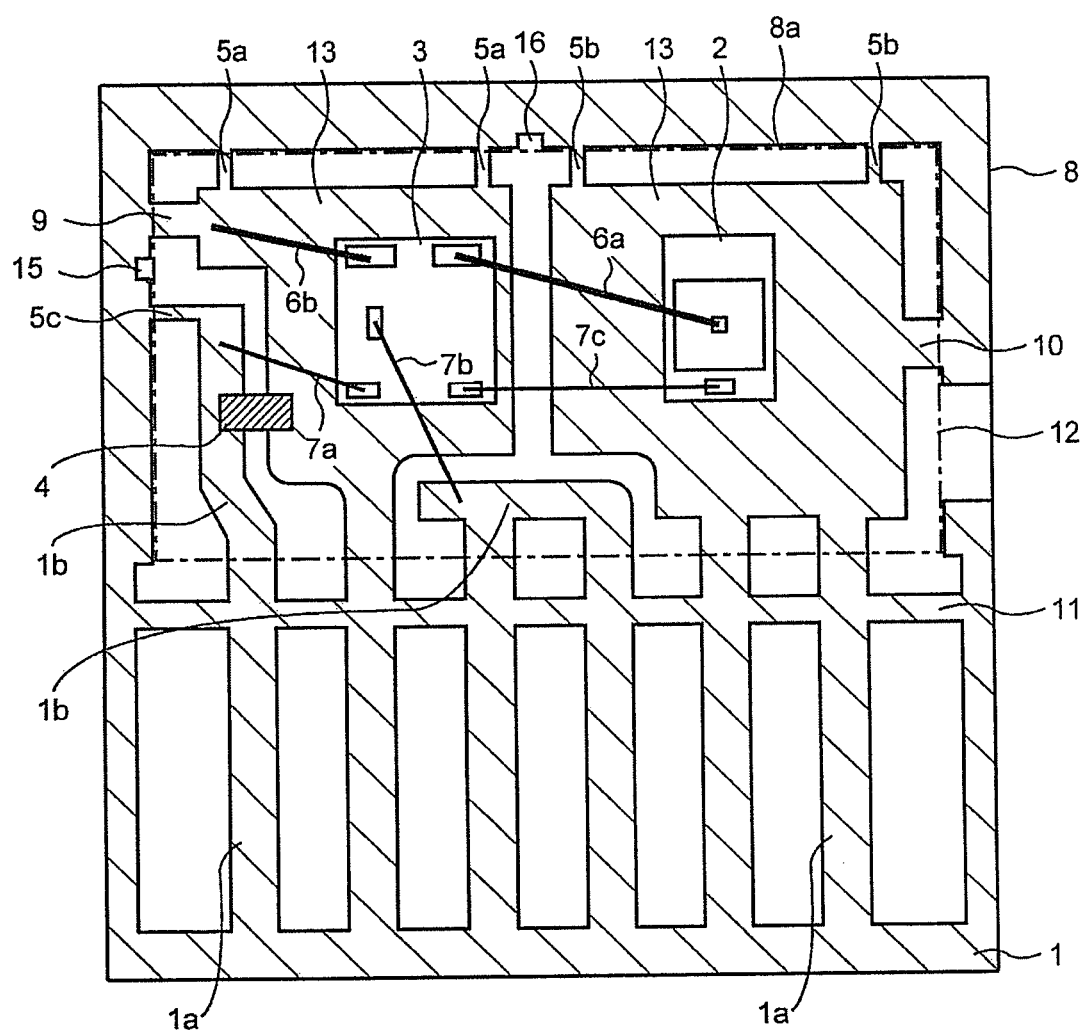
FIG. 2 is a plan view showing a method of manufacturing a resin sealing semiconductor device before it is resin-sealed in a second embodiment of the invention.

In the second embodiment of the invention, by forming the notches 15 and 16 etc in the outer frame 8 of the lead frame 1, as shown in FIGS. 5 and 2, a portion of the outer frame 8 of the lead frame 1 remaining on the side surface of the resin package 12 is separated and the hanging lead 5c etc and the connection lead 9 etc are not connected to prevent shortcircuit between the semiconductor device 2 etc. The notches 15 etc are formed small on the side of the outer frame 8 of the lead frame 1, that abuts the resin package 12 as shown in FIG. 2, and have size such that those has no influence on the total strength of the lead frame 1. The width is such that a remaining portion of the outer frame 8 of the lead frame 1 is separated. The length is such that the end is exposed from the resin package 12. Although FIG. 2 shows the two notches 15 and 16 only, these are formed between the hanging leads including the connection leads that need to be separated.

The forming of the notch 15 etc in the outer frame 8 of the lead frame 1 also has an advantage that the notch 15 etc are used as alignment marks when the lead frame 1 is held between the upper mold 100 and the lower mold 101 in the resin sealing process and thus the inner side of the outer frame 8 of the lead frame 1 and the mold 100 etc are aligned with high accuracy. The notch 15 etc are concaved from the inner side toward the outer side of the outer frame 8, and thus resin burrs 18 are formed in the concaves in the similar manner to the resin burrs 17 formed between the tie bars 11 on the outer leads 1a and the resin package 12, as shown in FIG. 5.

Therefore, when the outer frame 8 is cut next, since the outer frame 8 is cut almost at the boundary between the outer frame 8 and the resin package 12 by targeting the black resin burrs 18 inside the notch 15 etc, the occurrence probability of the remaining outer frame 8 becomes low. Furthermore, since the outer frame 8 of the lead frame 1 is cut across the notch 15 etc, even if a portion of the outer frame 8 of the lead frame 1 remains on the side surface of the resin package 12, the remaining portion of the outer frame 8 is separated at the notch 15 etc. In detail, even when a portion of the outer frame 8 of the lead frame 1 remains, the notch 15 etc realizes the separation of the remaining portion of the outer frame 8.

Therefore, the existence of the notch 15 prevents the connection between the hanging lead 5a and the connection lead 9 that extend from the island 13 where the controller semiconductor die 3 is mounted and the hanging lead 5c that extend from the inner lead 1b where one of the electrodes of the die capacitor 4 is mounted. Similarly, the existence of the notch 16 prevents the connection between the hanging lead 5a extending from the island 13 where the controller semiconductor die 3 and the die capacitor 4 are mounted and the hanging lead 5b extending from the island 13 where the power semiconductor die 2 is mounted due to a remaining portion of the outer frame 8 of the lead frame 1.

As a result, the second embodiment of the invention prevents shortcircuit between the semiconductor dies etc due to a remaining portion of the outer frame 8 of the lead frame 1 after the cutting of the outer frame 8, and realizes the manufacture of a resin sealing type semiconductor device with high reliability. Although the notch 15 etc are formed in a U shape in FIG. 2, other different shapes than the U shape, such as a V shape or a semicircle shape extending from the inner side toward the outer side of the outer frame 8, are possible as long as the object of the invention is achieved.

Furthermore, although an Al wire is used as an ultrasonic wire-bonding member in the description of the embodiments of the invention, the invention is also applicable to a case of using a wire with a copper base. As for the package, an SIP type package is used for the description, but the invention is also applicable to other package such as a DIP (Dual In-line Package) type package etc as long as the concept of the invention is unchanged.

Even when the wire-bonding between the pad electrode of the semiconductor die 3 etc, and the wire-bonding portion 14a etc on the lead frame 1 or the pad electrode of the semiconductor die 2 are performed using an Al wire 6a etc by ultrasonic wire-bonding, firm bonding is achieved. Furthermore, even when a portion of the outer frame 8 of the lead frame 1 remains on the circumference of the resin package 12, shortcircuit is prevented between the semiconductor die 2 etc sealed in the resin package 12.

What is claimed is:

1. A resin sealing type semiconductor device comprising:
a lead frame comprising an island, a wire-bonding portion located in the island, a first extension portion extending straight from the island in a first direction in plan view of the semiconductor device and a second extension portion extending straight from the island in a second direction in the plan view of the semiconductor device, the first direction being different from the second direction so that the first and second directions are substantially perpendicular to each other;
a semiconductor die die-bonded to the island and wire-bonded to the wire-bonding portion using a wire comprising aluminum or copper; and
a resin package sealing the lead frame and the semiconductor die,
wherein one side edge of the resin package extends in the first direction, and another side edge of the resin package extends in the second direction.

2. The resin sealing type semiconductor device of claim 1, wherein the wire-bonding portion of the lead frame is connected to an outer frame of the lead frame.

3. A resin sealing type semiconductor device comprising:
a lead frame elongated to have a first side edge and a second side edge in plan view of the semiconductor device, the first side edge being longer than and not parallel to the second side edge;
a semiconductor die that is die-bonded to and wire-bonded to the lead frame; and
a resin package sealing the lead frame and the semiconductor die, wherein the first side edge of the lead frame is exposed along the resin package, and the exposed portion of the lead frame is separated into two portions by a cut made in the lead frame.

4. The resin sealing type semiconductor device of claim 3, wherein the lead frame comprises an island to which the semiconductor die is die-bonded and two hanging leads connecting the island and the exposed portion of the lead frame that is an outer frame of the lead frame remaining after a packaging of the semiconductor device, wherein the cut is made between the two hanging leads.

5. A lead frame comprising:

an island;

an outer frame surrounding the island and defining an outer periphery of the lead frame; and a plurality of connection portions connecting the island and the outer frame, wherein a notch is formed in the outer frame between two connection portions so as not to cut through the outer frame.

6. The lead frame of claim 5, wherein the connection portions comprise hanging leads and connection leads that are wider than the hanging leads, and one of the two connection portions is a connection lead.

7. A lead frame comprising:

a first outer frame portion extending in a first direction;

a second outer frame portion extending in a second direction crossing the first direction;

a third outer frame portion extending in the second direction;

a first island and a second island that are disposed in an area defined by the first, second and third outer frame portions;

a plurality of first leads extending from the first island in the second direction;

a plurality of second leads extending from the second island in the second direction; and a tie bar connecting the second and third outer frame portions, wherein the first inland is connected to the first outer frame portion by at least one of the first leads, connected to the second outer frame portion by a lead extending in the first direction and connected to the tie bar by at least one of the first leads, and the second inland is connected to the first outer frame portion by at least one of the second leads, connected to the third outer frame portion by a lead extending in the first direction and connected to the tie bar by at least one of the second leads.

* * * * *